United States Patent
Mathews et al.

(10) Patent No.: US 11,526,469 B1
(45) Date of Patent: Dec. 13, 2022

(54) FILE SYSTEM REORGANIZATION IN THE PRESENCE OF INLINE COMPRESSION

(71) Applicant: EMC IP Holding Company LLC, Hopkinton, MA (US)

(72) Inventors: Alexander Mathews, Morganville, NJ (US); Marc De Souter, Wayne, NJ (US); Yining Si, Sherborn, MA (US); Philippe Armangau, Acton, MA (US); Ahsan Rashid, Edison, NJ (US); Pranit Sethi, Santa Clara, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 861 days.

(21) Appl. No.: 15/664,245

(22) Filed: Jul. 31, 2017

(51) Int. Cl.
G06F 16/17 (2019.01)
G06F 16/13 (2019.01)
G06F 16/18 (2019.01)

(52) U.S. Cl.
CPC .......... *G06F 16/1727* (2019.01); *G06F 16/13* (2019.01); *G06F 16/1865* (2019.01)

(58) Field of Classification Search
CPC ............ G06F 12/0804; G06F 12/0868; G06F 12/128; G06F 2212/154; G06F 2212/312; G06F 2212/314; G06F 2212/401; G06F 2212/502; G06F 16/1727
See application file for complete search history.

(56) References Cited

U.S. PATENT DOCUMENTS

| | | | | |
|---|---|---|---|---|
| 7,873,619 B1 * | 1/2011 | Faibish | ........... | G06F 16/13 707/705 |
| 7,996,636 B1 * | 8/2011 | Prakash | ........... | G06F 3/0619 711/162 |
| 8,190,850 B1 * | 5/2012 | Davenport | ........... | G06F 16/10 711/202 |
| 8,473,652 B2 * | 6/2013 | Amit | ........... | G06F 16/00 710/68 |
| 8,615,500 B1 * | 12/2013 | Armangau | ........... | G06F 16/1752 707/693 |
| 9,348,842 B2 * | 5/2016 | Wu | ........... | G06F 12/0862 |
| 9,779,023 B1 * | 10/2017 | Armangau | ........... | G06F 12/023 |
| 9,880,743 B1 * | 1/2018 | Armangau | ........... | G06F 3/0631 |

(Continued)

OTHER PUBLICATIONS

Klonatos et al., "Transparent Online Storage Compression at the Block-Level;" ACM Transactions on Storage, vol. 8, No. 2, Article 5, Publication date: May 2012. (Year: 2012).*

*Primary Examiner* — Ashish Thomas
*Assistant Examiner* — Mellissa M. Ohba
(74) *Attorney, Agent, or Firm* — Ryan, Mason & Lewis, LLP

(57) ABSTRACT

A method for file system reorganization in the presence of inline compression includes obtaining a virtual block pointer for an original compressed segment to be reorganized, the original compressed segment comprising compressed allocation units of data stored in a storage system, wherein the virtual block pointer comprises an extent list identifying the compressed allocation units in the original compressed segment and a pointer to where the original compressed segment is stored; copying only the referenced compressed allocation units in the original compressed segment to a new compressed segment in a substantially contiguous manner; updating the extent list to identify the referenced compressed allocation units in the new compressed segment, and the pointer to where the new compressed segment is stored; and freeing the original compressed segment.

20 Claims, 7 Drawing Sheets

(56) References Cited

U.S. PATENT DOCUMENTS

| | | | | |
|---|---|---|---|---|
| 9,985,649 B1* | 5/2018 | Bassov | .................... | H03M 7/60 |
| 10,156,993 B1* | 12/2018 | Armangau | ............ | G06F 3/0608 |
| 10,157,006 B1* | 12/2018 | Armangau | .............. | G06F 3/065 |
| 2006/0136365 A1* | 6/2006 | Kedem | .................... | G06F 3/064 |
| 2010/0274773 A1* | 10/2010 | Pawar | ................ | G06F 16/9535 |
| | | | | 707/693 |
| 2015/0339314 A1* | 11/2015 | Collins | ............... | G06F 16/1744 |
| | | | | 707/627 |
| 2016/0011816 A1* | 1/2016 | Aizman | ................ | G06F 3/0604 |
| | | | | 711/117 |
| 2017/0031940 A1* | 2/2017 | Subramanian | .......... | G06F 16/13 |

* cited by examiner

FIG. 5

COMPACTION/RELOCATION PROCESS ⎯ 500

510 — OBTAIN VBM 240 AND CORRESPONDING COMPRESSED SEGMENT 250 FOR COMPACTION;

520 — LOCK VBM 240 OF COMPRESSED SEGMENT 250;

530 — IDENTIFY REFERENCED COMPRESSED EXTENTS IN COMPRESSED SEGMENT 250;

540 — ALLOCATE SMALLER SPACE FOR NEW COMPRESSED SEGMENT 250' (FIG. 2B) BASED ON FREEABLE SPACE FROM VBM 240;

550 — COPY REFERENCED COMPRESSED EXTENTS TO A BUFFER TO BE WRITTEN TO NEW COMPRESSED SEGMENT 250' TO OBTAIN CONTIGUOUS REFERENCED COMPRESSED EXTENTS IN NEW COMPRESSED SEGMENT 250';

560 — WRITE BUFFER TO NEW COMPRESSED SEGMENT 250';

570 — UPDATE METADATA (IN VBM 240): (i) FSBN 241 POINTS TO NEW COMPRESSED SEGMENT 250', AND (ii) NUMBER OF COMPRESSED EXTENTS 243 AND EXTENT LIST 244 REMOVE UNREFERENCED COMPRESSED EXTENTS, FREEING ORIGINAL COMPRESSED SEGMENT 250, WHILE RECORDING METADATA CHANGES IN TRANSACTION LOG;

580 — UPON COMPLETION OF METADATA UPDATES, UNLOCK VBM 240.

FIG. 6

IN-PLACE COMPACTION PROCESS ⟋ 600

- 610 — OBTAIN VBM 240 FOR CORRESPONDING COMPRESSED SEGMENT 250 FOR COMPACTION;

- 620 — LOCK VBM 240 OF COMPRESSED SEGMENT 250;

- 630 — IDENTIFY REFERENCED COMPRESSED EXTENTS IN COMPRESSED SEGMENT 250;

- 640 — ALLOCATE BUFFER OF "NEW ALLOCATED SIZE" FOR OVERWRITE OF COMPRESSED SEGMENT 250;

- 650 — MOVE ONLY REFERENCED COMPRESSED EXTENTS TO ALLOCATED BUFFER TO BE RE-WRITTEN TO (SAME) SEGMENT 250 TO OBTAIN CONTIGUOUS REFERENCED COMPRESSED EXTENTS IN THE SEGMENT 250;

- 660 — WRITE BUFFER TO THE COMPRESSED SEGMENT 250;

- 670 — UPDATE METADATA (IN VBM 240): NUMBER OF COMPRESSED EXTENTS 243 AND EXTENT LIST 244 IN SEGMENT VBM 240 TO REMOVE UNREFERENCED COMPRESSED EXTENTS, FREEING UNUSED TAIL (FREEABLE AMOUNT OF BLOCKS) OF ORIGINAL COMPRESSED SEGMENT 250, WHILE RECORDING COMPACTED VERSION OF THE COMPRESSED SEGMENT DATA AND METADATA CHANGES IN TRANSACTION LOG;

- 680 — UPON METADATA UPDATES, UNLOCK VBM.

FILE SYSTEM REORGANIZATION IN THE PRESENCE OF INLINE COMPRESSION

FIELD

The present application relates to file system reorganization in storage systems.

BACKGROUND

Some data storage systems employ file system reorganization techniques that relocate one or more data objects, to improve storage efficiency. When a given data object is relocated, the corresponding metadata must often be updated to reflect the new location and/or content of the given data object. A need exists for improved techniques for file system reorganization in the presence of inline compression.

SUMMARY

Methods and apparatus are provided for file system reorganization in the presence of inline compression. In one embodiment, an exemplary method comprises obtaining a virtual block pointer for an original compressed segment to be reorganized, the original compressed segment comprising a plurality of compressed allocation units of data stored in a storage system, wherein the virtual block pointer comprises an extent list identifying the plurality of compressed allocation units in the original compressed segment and a file system block number pointing to where the original compressed segment is stored in the storage system; copying only the referenced compressed allocation units in the original compressed segment that are referenced by at least one file in a file system to a new compressed segment in a substantially contiguous manner; updating (i) the extent list to identify the referenced compressed allocation units in the new compressed segment, and (ii) the file system block number to point to where the new compressed segment is stored in the storage system; and freeing the original compressed segment.

In some embodiments, an in-place compaction process is applied within the original compressed segment to obtain a compacted original compressed segment, when free space is not available for relocation of one or more allocation units. The in-place compaction process comprises moving only the referenced compressed allocation units within the original compressed segment to obtain the compacted original compressed segment comprising a substantially contiguous set of referenced compressed allocation units. The in-place compaction process comprises optionally (i) updates the extent list to remove the unreferenced compressed allocation units from the original compressed segment; (ii) frees a tail portion of the original compressed segment; and (iii) records the compacted original compressed segment and the updated extent list in a transaction log.

Other illustrative embodiments include, without limitation, apparatus, systems, methods and computer program products comprising processor-readable storage media.

BRIEF DESCRIPTION OF THE DRAWINGS

FIG. 5 illustrates exemplary pseudo code for a compaction/relocation process, according to one embodiment of the disclosure;

FIG. 6 illustrates exemplary pseudo code for an in-place compaction process, according to one embodiment of the disclosure;

DETAILED DESCRIPTION

Figure 1:
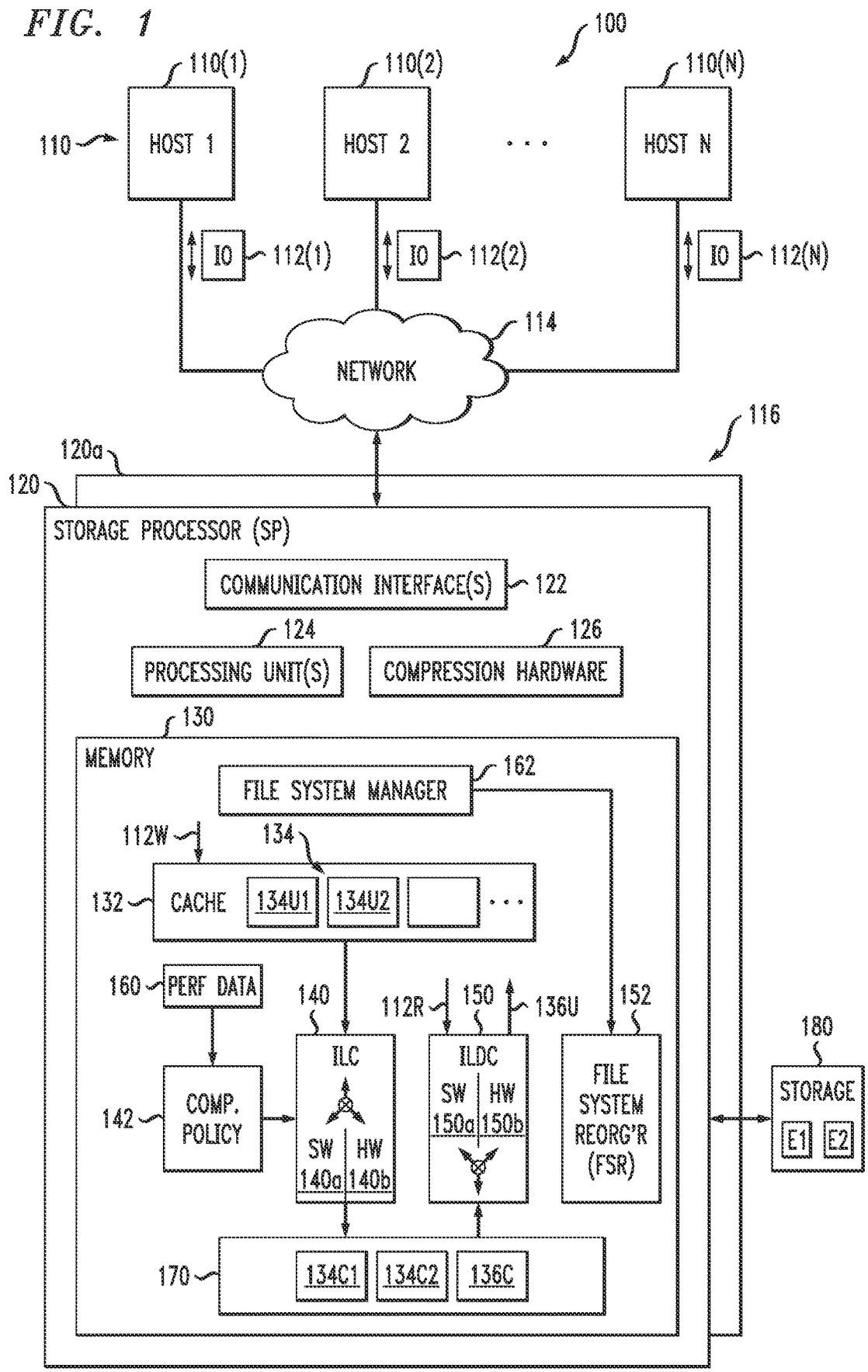
FIG. 1 is an example of an embodiment of a computer system that may utilize the techniques described herein.

Illustrative embodiments of the present disclosure will be described herein with reference to exemplary communication, storage and processing devices. It is to be appreciated, however, that the disclosure is not restricted to use with the particular illustrative configurations shown. Aspects of the disclosure provide methods and apparatus for file system reorganization in storage systems in the presence of inline compression.

Data compression may be characterized as the process of encoding source information using an encoding scheme into a compressed form having fewer bits than the original or source information. Different encoding schemes may be used in connection with data compression.

Data reduction may be a LUN (logical unit number) attribute that can be enabled or disabled. When data reduction is enabled, data on a LUN may be processed as a background task. Compression, for example, may be performed in three different phases. The first phase comprises an initial compression that occurs when data compression is first enabled for a LUN. An entire LUN may be processed during this phase. The second phase is compression of new data that is sent by a host when the host sends a write request to a LUN. In such a case, the data is written in an uncompressed format and compressed asynchronously in background at a later time. As a result, when new data is written to a compressed LUN, the consumed capacity of the compressed LUN may increase temporarily because the new data is not written in a compressed format initially. Further, when a storage system receives a new write request directed to compressed data, the compressed data may need to be first uncompressed, the uncompressed data is updated with the new write request, and updated uncompressed data is compressed again. Alternatively, when a storage system receives a new write request directed to compressed data, the compressed data may be left as-is and new data may be written to a new location.

Inline compression (also referred to herein as "ILC") provides the ability to reduce the amount of storage required to store user data on a storage device of a storage system by compressing portions of the data at the time the data is first written to the storage device. Further, storage system resources such as CPU (central processing unit) resources, that may otherwise remain unused, are utilized to perform inline data compression on a write data path indicating that data is compressed prior to writing the data on a storage device. Generally, ILC may optionally be enabled by default on a storage system. However, a user may be provided the ability to make a decision regarding which storage objects should be subject to compression. Further, ILC is intended to lower the cost of storage consumed (e.g., dollars per gigabytes ($/GB)), but it is also a goal for ILC to improve the cost based on a number of IO (input/output) operations performed in a storage system (IOPs (input/output operations) performed in a specific time) through better utilization.

In one or more embodiments, as discussed further below in conjunction with FIGS. 2A and 2B, the inline compression techniques use VBMs (virtual block maps) to track the compressed extents of one or more files. The VBM points to a compressed segment that holds the compressed data. The nature of how the VBM and the extents that it tracks are used allows there to be hidden fragmentation in the compressed segment. Hidden fragmentation will occur when multiple extents in the VBM become unreferenced, which will happen through overwrites or unmap operations. When that hidden fragmentation is equivalent to the size of one or more data blocks (e.g., allocation units), it is desirable to free that space to be used by block allocation or to be reclaimed.

In some embodiments, when block relocation needs to relocate a compressed segment, the block relocation will only move the portions of the compressed segment that are still associated with referenced extents in the VBM. In essence, the disclosed block relocation performs compaction of the compressed extents in the VBM and the associated compressed data, so that the free fragmented space in the compressed segment can be freed. Another embodiment is disclosed for space maker file system reorganization, in that if there is no free space to relocate a compressed segment, then the compaction is done in-place to be able to free the hidden free space in the segment. Doing this compaction is often necessary to be able to provide better space savings to the user.

Data storage systems commonly arrange data in file systems, and file systems commonly store data, as well as metadata, in blocks. As is known, a "block" is the smallest unit of storage that a file system can allocate. Blocks for a given file system are generally of fixed size, such as 4 KB (kilobytes), 8 KB, or some other fixed size.

File systems typically categorize blocks as either allocated or free. Allocated blocks are those which are currently in use, whereas free blocks are those which are not currently in use. As a file system operates, the file system tends to allocate new blocks, to accommodate new data, but the file system also tends to generate new free blocks, as previously allocated blocks become free. The file system may run utilities (e.g., space maker, file system reorganizer) to coalesce ranges of contiguous free blocks. For example, a utility may move data found in allocated blocks between areas of the file system to create large regions of entirely free blocks. In various examples, the file system may return such regions of free blocks to a storage pool; the file system may also make such regions available to accommodate new writes of sequential data.

In a storage system enabled with inline data compression, data of the file system is generally compressed down to sizes smaller than a block and such compressed data is packed together in multi-block segments. Further, a file system manager may include a persistent file data cache (PFDC) aggregation logic that selects a set of allocation units (also referred to herein as "data fragments" or "storage extents" or "blocks") for compressing the set of allocation units and organizes the compressed allocation units in a segment. Further, each compressed allocation unit in a segment may also be simply referred to herein as a fragment. Thus, data of a file system may be stored in a set of segments. A segment may be composed from multiple contiguous blocks where data stored in the segment includes multiple compressed storage extents having various sizes.

Further, for each compressed storage extent in a segment of a file system, a corresponding weight is associated where the weight is arranged to indicate whether the respective storage extent is currently part of any file in the file system. In response to performing a file system operation that changes the weight of a storage extent in a segment of a file system to a value that indicates that the storage extent is no longer part of any file in the file system, the storage extent is marked as a free storage extent such that a scavenging utility can scavenge free space at a later time.

Conventionally, when a file system operation causes a file system to update data stored in an allocation unit, new data is written to a new location by allocating a new data fragment in a new segment. In such a conventional system, in such an example, the old allocation unit remains unused and may be scavenged by a storage space scavenging utility (e.g., space maker or garbage collection) during background processing at a later time. Further, generally, a storage space scavenging utility frees storage space associated with unused allocation units if there are sufficient numbers of allocation units in a segment that can be scavenged. For example, when each allocation unit in a segment is marked as unused, a scavenging utility frees storage space associated with the segment. Thus, in such a conventional system, data of a file system may be scattered throughout a set of segments such that there exists unused allocation units within various segments that have not been scavenged yet.

Conventionally, by allocating a new extent or allocation unit each time data of an existing extent or allocation unit of a file system is updated causes the file system to become fragmented over time, whereby storage for files of the file system may be allocated in small block portions of the underlying LUNs. In such a conventional system, each such small block portion may denote a logically contiguous set of LUN blocks or locations where the different contiguous block portions may be scattered or fragmented through the logical address space of the underlying LUN(s). Further, in such a conventional system, once a file system is fragmented, new sequential writes may not find contiguous free block sets within the file system address space to be allocated for a file. Consequently, in such a conventional system, the foregoing may result in a performance bottleneck in file systems, for example, storing data of file systems on physical storage devices, such as rotating disk drives, as well as in cases where rotating disk drives may be used in combination with flash memory devices or other solid state storage devices. Thus, in such a conventional system, allocating a new extent each time a request is received to overwrite data of an existing extent leads to wasting a significant amount of storage space when a file system performs a large number of over-write operations and reduces overall storage space savings associated with compression of data. In addition, generally, processing bandwidth of a storage space scavenging utility (e.g., space maker utility) is limited in nature which induces a flash wear in a conventional storage system by repeatedly writing to flash storage devices. Further, in such a conventional system, in at least one scenario, for example, all blocks that make up a segment may be allocated, even though the segment may contain enough free space to encompass one or more blocks. Yet, in such a conventional system, when working on segments containing compressed data, storage space scavenging utilities may fail to properly identify these areas and may thus consume valuable storage system resources inefficiently.

By contrast, at least some implementations in accordance with the current technique enable a file system to re-use data fragments (or "allocation units") of a compressed segment for updating data stored in such data fragments. In at least one embodiment of the current technique, re-using data fragments in a compressed segment reduces the processing performed by a storage space scavenging utility (e.g., space maker, garbage collection utility) for freeing storage space in a storage stripe thereby reducing a flash wear on a flash storage device. Further, in at least one embodiment of the current technique, in a storage system enabled with inline data compression, an existing data fragment is overwritten with new updated data upon determining that the existing data fragment has not been shared among two or more files and the size of the existing data fragment can accommodate the new updated data in a compressed format resulting from a subsequent write I/O request. Further, in at least one embodiment of the current technique, when updated data is written to an existing data fragment by re-using the existing data fragment, the compressed data fragment is aligned to a disk sector level in order to avoid copy-on-write operation when such data fragment is re-used.

Described in following paragraphs are techniques that may be used in an embodiment in accordance with the techniques disclosed herein to efficiently use contiguous free block sets of file system address space that may be allocated for use, for example, for a file system.

FIG. 1 depicts an example embodiment of a system 100 that may be used in connection with performing the techniques described herein. Here, multiple host computing devices ("hosts") 110, shown as devices 110(1) through 110(N), access a data storage system 116 over a network 114. The data storage system 116 includes a storage processor, or "SP," 120 and storage 180. In one example, the storage 180 includes multiple disk drives, such as magnetic disk drives, electronic flash drives, optical drives, and/or other types of drives. Such disk drives may be arranged in RAID (Redundant Array of Independent/Inexpensive Disks) groups, for example, or in any other suitable way.

In an example, the data storage system 116 includes multiple SPs, like the SP 120 (e.g., a second SP, 120a). The SPs may be provided as circuit board assemblies, or "blades," that plug into a chassis that encloses and cools the SPs. The chassis may have a backplane for interconnecting the SPs, and additional connections may be made among SPs using cables. No particular hardware configuration is required, however, as any number of SPs, including a single SP, may be provided and the SP 120 can be any type of computing device capable of processing host IOs.

The network 114 may be any type of network or combination of networks, such as a storage area network (SAN), a local area network (LAN), a wide area network (WAN), the Internet, and/or some other type of network or combination of networks, for example. The hosts 110(1-N) may connect to the SP 120 using various technologies, such as Fibre Channel, iSCSI (Internet Small Computer Systems Interface), NFS (Network File System), SMB (Server Message Block) 3.0, and CIFS (Common Internet File System), for example. Any number of hosts 110(1-N) may be provided, using any of the above protocols, some subset thereof, or other protocols besides those shown. As is known, Fibre Channel and iSCSI are block-based protocols, whereas NFS, SMB 3.0, and CIFS are file-based protocols. The SP 120 is configured to receive IO requests 112(1-N) according to block-based and/or file-based protocols and to respond to such IO requests 112(1-N) by reading and/or writing the storage 180.

As further shown in FIG. 1, the SP 120 includes one or more communication interfaces 122, a set of processing units 124, compression hardware 126, and memory 130. The communication interfaces 122 may be provided, for example, as SCSI target adapters and/or network interface adapters for converting electronic and/or optical signals received over the network 114 to electronic form for use by the SP 120. The set of processing units 124 includes one or more processing chips and/or assemblies. In a particular example, the set of processing units 124 includes numerous multi-core CPUs.

The compression hardware 126 includes dedicated hardware, e.g., one or more integrated circuits, chipsets, sub-assemblies, and the like, for performing data compression and decompression in hardware. The hardware is "dedicated" in that it does not perform general-purpose computing but rather is focused on compression and decompression of data. In some examples, compression hardware 126 takes the form of a separate circuit board, which may be provided as a daughterboard on SP 120 or as an independent assembly that connects to the SP 120 over a backplane, midplane, or set of cables, for example. A non-limiting example of compression hardware 126 includes the Intel® QuickAssist Adapter, which is available from Intel Corporation of Santa Clara, Calif.

The memory 130 includes both volatile memory (e.g., RAM (random access memory)), and non-volatile memory, such as one or more ROMs (read only memories), disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 are caused to carry out the operations of the software constructs. Although certain software constructs are specifically shown and described, it is understood that the memory 130 typically includes many other software constructs, which are not shown, such as an operating system, various applications, processes, and daemons.

As further shown in FIG. 1, the memory 130 "includes," i.e., realizes by execution of software instructions, a cache 132, an inline compression (ILC) engine 140, an inline decompression (ILDC) engine 150, and a data object 170. A compression policy 142 provides control input to the ILC engine 140. A decompression policy (not shown) provides control input to the ILDC engine 150. Both the compression policy 142 and the decompression policy receive performance data 160, that describes a set of operating conditions in the data storage system 116.

In an example, the data object 170 is a host-accessible data object, such as a LUN, a file system, or a virtual machine disk (e.g., a VVol (Virtual Volume), available from VMWare, Inc. of Palo Alto, Calif.). The SP 120 exposes the data object 170 to hosts 110 for reading, writing, and/or other data operations. In one particular, non-limiting example, the SP 120 runs an internal file system and implements the data object 170 within a single file of that file system. In such an example, the SP 120 includes mapping (not shown) to convert read and write requests from hosts 110 (e.g., IO requests 112(1-N)) to corresponding reads and writes to the file in the internal file system.

As further shown in FIG. 1, ILC engine 140 includes a software component (SW) 140a and a hardware component (HW) 140b. The software component 140a includes a compression method, such as an algorithm, which may be implemented using software instructions. Such instructions may be loaded in memory and executed by processing units 124, or some subset thereof, for compressing data directly, i.e., without involvement of the compression hardware 126. In comparison, the hardware component 140b includes software constructs, such as a driver and API (application programmer interface) for communicating with compression hardware 126, e.g., for directing data to be compressed by the compression hardware 126. In some examples, either or both components 140a and 140b support multiple compression algorithms. The compression policy 142 and/or a user may select a compression algorithm best suited for current operating conditions, e.g., by selecting an algorithm that produces a high compression ratio for some data, by selecting an algorithm that executes at high speed for other data, and so forth.

For decompressing data, the ILDC engine 150 includes a software component (SW) 150a and a hardware component (HW) 150b. The software component 150a includes a decompression algorithm implemented using software instructions, which may be loaded in memory and executed by any of processing units 124 for decompressing data in software, without involvement of the compression hardware 126. The hardware component 150b includes software constructs, such as a driver and API for communicating with compression hardware 126, e.g., for directing data to be decompressed by the compression hardware 126. Either or both components 150a and 150b may support multiple decompression algorithms. In some examples, the ILC engine 140 and the ILDC engine 150 are provided together in a single set of software objects, rather than as separate objects, as shown.

In one example operation, hosts 110(1-N) issue IO requests 112(1-N) to the data storage system 116 to perform reads and writes of data object 170. SP 120 receives the IO requests 112(1-N) at communications interface(s) 122 and passes them to memory 130 for further processing. Some IO requests 112(1-N) specify data write requests 112W, and others specify data read requests 112R, for example. Cache 132 receives write requests 112W and stores data specified thereby in cache elements 134. In a non-limiting example, the cache 132 is arranged as a circular data log, with cache elements 134 that are specified in newly-arriving write requests 112W added to a head and with further processing steps pulling cache elements 134 from a tail. In an example, the cache 132 is implemented in DRAM (Dynamic Random Access Memory), the contents of which are mirrored between SPs 120 and 120a and persisted using batteries. In an example, SP 120 may acknowledge write requests 112W back to originating hosts 110 once the data specified in those write requests 112W are stored in the cache 132 and mirrored to a similar cache on SP 120a. It should be appreciated that the data storage system 116 may host multiple data objects, i.e., not only the data object 170, and that the cache 132 may be shared across those data objects.

When the SP 120 is performing writes, the ILC engine 140 selects between the software component 140a and the hardware component 140b based on input from the compression policy 142. For example, the ILC engine 140 is configured to steer incoming write requests 112W either to the software component 140a for performing software compression or to the hardware component 140b for performing hardware compression.

In an example, cache 132 flushes to the respective data objects, e.g., on a periodic basis. For example, cache 132 may flush a given uncompressed element 134U1 to data object 170 via ILC engine 140. In accordance with compression policy 142, ILC engine 140 selectively directs data in element 134U1 to software component 140a or to hardware component 140b. In this example, compression policy 142 selects software component 140a. As a result, software component 140a receives the data of element 134U1 and applies a software compression algorithm to compress the data. The software compression algorithm resides in the memory 130 and is executed on the data of element 134U1 by one or more of the processing units 124. Software component 140a then directs the SP 120 to store the resulting compressed data 134C1 (the compressed version of the data in element 134U1) in the data object 170. Storing the compressed data 134C1 in data object 170 may involve both storing the data itself and storing any metadata structures required to support the compressed data 134C1, such as block pointers, a compression header, and other metadata.

It should be appreciated that this act of storing compressed data 134C1 in data object 170 provides the first storage of such data in the data object 170. For example, there was no previous storage of the data of element 134U1 in the data object 170. Rather, the compression of data in element 134U1 proceeds "inline," in one or more embodiments, because it is conducted in the course of processing the first write of the data to the data object 170.

Continuing to another write operation, cache 132 may proceed to flush a given element 134U2 to data object 170 via ILC engine 140, which, in this case, directs data compression to hardware component 140b, again in accordance with compression policy 142. As a result, hardware component 140b directs the data in element 134U2 to compression hardware 126, which obtains the data and performs a high-speed hardware compression on the data. Hardware component 140b then directs the SP 120 to store the resulting compressed data 134C2 (the compressed version of the data in element 134U2) in the data object 170. Compression of data in element 134U2 also takes place inline, rather than in the background, as there is no previous storage of data of element 134U2 in the data object 170.

In an example, directing the ILC engine 140 to perform hardware or software compression further entails specifying a particular compression algorithm. The algorithm to be used in each case is based on compression policy 142 and/or specified by a user of the data storage system 116. Further, it should be appreciated that compression policy 142 may operate ILC engine 140 in a pass-through mode, i.e., one in which no compression is performed. Thus, in some examples, compression may be avoided altogether if the SP 120 is too busy to use either hardware or software compression.

In some examples, storage 180 is provided in the form of multiple extents, with two extents E1 and E2 particularly shown. In an example, the data storage system 116 monitors a "data temperature" of each extent, i.e., a frequency of read and/or write operations performed on each extent, and selects compression algorithms based on the data temperature of extents to which writes are directed. For example, if extent E1 is "hot," meaning that it has a high data temperature, and the data storage system 116 receives a write directed to E1, then compression policy 142 may select a compression algorithm that executes at a high speed for compressing the data directed to E1. However, if extent E2 is "cold," meaning that it has a low data temperature, and the data storage system 116 receives a write directed to E2, then compression policy 142 may select a compression algorithm that executes at high compression ratio for compressing data directed to E2.

When SP 120 performs reads, the ILDC engine 150 selects between the software component 150a and the hardware component 150b based on input from the decompression policy and also based on compatible algorithms. For example, if data was compressed using a particular software algorithm for which no corresponding decompression algorithm is available in hardware, the ILDC engine 150 may steer the compressed data to the software component 150a, as that is the only component equipped with the algorithm needed for decompressing the data. However, if both components 150a and 150b provide the necessary algorithm, then selection among components 150a and 150b may be based on decompression policy.

To process a read request 112R directed to compressed data 136C, the ILDC engine 150 accesses metadata of the data object 170 to obtain a header for the compressed data 136C. The compression header specifies the particular algorithm that was used to compress the compressed data 136C. The ILDC engine 150 may then check whether the algorithm is available to software component 150a, to hardware component 150b, or to both. If the algorithm is available only to one or the other of components 150a and 150b, the ILDC engine 150 directs the compressed data 136C to the component that has the necessary algorithm. However, if the algorithm is available to both components 150a and 150b, the ILDC engine 150 may select between components 150a and 150b based on input from the decompression policy. If the software component 150a is selected, the software component 150a performs the decompression, i.e., by executing software instructions on one or more of the set of processing units 124. If the hardware component 150b is selected, the hardware component 150b directs the compression hardware 126 to decompress the compresssed data 136C. The SP 120 then returns the resulting uncompressed data 136U to the requesting host 110.

It should be appreciated that the ILDC engine 150 is not required to use software component 150a to decompress data that was compressed by the software component 140a of the ILC engine 140. Nor is it required that the ILDC engine 150 use hardware component 150b to decompress data that was compressed by the hardware component 140b. Rather, the component 150a or 150b may be selected flexibly as long as algorithms are compatible. Such flexibility may be especially useful in cases of data migration. For example, consider a case where data object 170 is migrated to a second data storage system (not shown). If the second data storage system does not include compression hardware 126, then any data compressed using hardware on data storage system 116 may be decompressed on the second data storage system using software.

With the arrangement of FIG. 1, the SP 120 intelligently directs compression and other data reduction tasks to software or to hardware based on operating conditions in the data storage system 116. For example, if the set of processing units 124 are already busy but the compression hardware 126 is not, the compression policy 142 can direct more compression tasks to hardware component 140b. Conversely, if compression hardware 126 is busy but the set of processing units 124 are not, the compression policy 142 can direct more compression tasks to software component 140a. Decompression policy may likewise direct decompression tasks based on operating conditions, at least to the extent that direction to hardware or software is not already dictated by the algorithm used for compression. In this manner, the data storage system 116 is able to perform inline compression using both hardware and software techniques, leveraging the capabilities of both while applying them in proportions that result in best overall performance.

In such an embodiment in which element 120 of FIG. 1 is implemented using one or more data storage systems, each of the data storage systems may include code thereon for performing the techniques as described herein.

Servers or host systems, such as 110(1)-110(N), provide data and access control information through channels to the storage systems, and the storage systems may also provide data to the host systems also through the channels. The host systems may not address the disk drives of the storage systems directly, but rather access to data may be provided to one or more host systems from what the host systems view as a plurality of logical devices or logical volumes (LVs). The LVs may or may not correspond to the actual disk drives. For example, one or more LVs may reside on a single physical disk drive. Data in a single storage system may be accessed by multiple hosts allowing the hosts to share the data residing therein. An LV or LUN may be used to refer to the foregoing logically defined devices or volumes.

The data storage system may be a single unitary data storage system, such as single data storage array, including two storage processors or compute processing units. Techniques herein may be more generally used in connection with any one or more data storage systems each including a different number of storage processors than as illustrated herein. The data storage system 116 may be a data storage array, such as a Unity™, a VNX™ or VNXe™ data storage array by EMC Corporation of Hopkinton, Mass., including a plurality of data storage systems 116 and at least two storage processors 120a. Additionally, the two storage processors 120a may be used in connection with failover processing when communicating with a management system for the storage system. Client software on the management system may be used in connection with performing data storage system management by issuing commands to the data storage system 116 and/or receiving responses from the data storage system 116 over a connection. In one embodiment, the management system may be a laptop or desktop computer system.

The particular data storage system as described in this embodiment, or a particular device thereof, such as a disk, should not be construed as a limitation. Other types of commercially available data storage systems, as well as processors and hardware controlling access to these particular devices, may also be included in an embodiment.

In some arrangements, the data storage system 116 provides block-based storage by storing the data in blocks of LUNs or volumes and addressing the blocks using logical block addresses (LBAs). In other arrangements, the data storage system 116 provides file-based storage by storing data as files of a file system and locating file data using inode structures. In yet other arrangements, the data storage system 116 stores LUNs and file systems, stores file systems within LUNs, and so on.

As further shown in FIG. 1, the memory 130 includes a file system and a file system manager 162. A file system is implemented as an arrangement of blocks, which are organized in an address space. Each of the blocks has a location in the address space, identified by FSBN (file system block number). Further, such address space in which blocks of a file system are organized may be organized in a logical address space where the file system manager 162 further maps respective logical offsets for respective blocks to physical addresses of respective blocks at specified FSBNs. In some cases, data to be written to a file system are directed to blocks that have already been allocated and mapped by the file system manager 162, such that the data writes prescribe overwrites of existing blocks. In other cases, data to be written to a file system do not yet have any associated physical storage, such that the file system must allocate new blocks to the file system to store the data. Further, for example, FSBN may range from zero to some large number, with each value of FSBN identifying a respective block location. The file system manager 162 performs various processing on a file system, such as allocating blocks, freeing blocks, maintaining counters, and scavenging for free space.

In at least one embodiment of the current technique, an address space of a file system may be provided in multiple ranges, where each range is a contiguous range of FSBNs (File System Block Number) and is configured to store blocks containing file data. In addition, a range includes file system metadata, such as inodes, indirect blocks (IBs), and virtual block maps (VBMs), for example, as discussed further below in conjunction with FIGS. 2A and 2B. As is known, inodes are metadata structures that store information about files and may include pointers to IBs. IBs include pointers that point either to other IBs or to data blocks. IBs may be arranged in multiple layers, forming IB trees, with leaves of the IB trees including block pointers that point to data blocks. Together, the leaf IBs of a file define the file's logical address space, with each block pointer in each leaf IB specifying a logical address into the file. Virtual block maps (VBMs) are structures placed between block pointers of leaf IBs and respective data blocks to provide data block virtualization. The term "VBM" as used herein describes a metadata structure that has a location in a file system that can be pointed to by other metadata structures in the file system and that includes a block pointer to another location in a file system, where a data block or another VBM is stored. However, it should be appreciated that data and metadata may be organized in other ways, or even randomly, within a file system. The particular arrangement described above herein is intended merely to be illustrative.

Further, in at least one embodiment of the current technique, ranges associated with an address space of a file system may be of any size and of any number. In some examples, the file system manager 162 organizes ranges in a hierarchy. For instance, each range may include a relatively small number of contiguous blocks, such as 16 or 32 blocks, for example, with such ranges provided as leaves of a tree. Looking up the tree, ranges may be further organized in CG (cylinder groups), slices (units of file system provisioning, which may be 256 MB (megabytes) or 1 GB in size, for example), groups of slices, and the entire file system, for example. Although ranges as described above herein apply to the lowest level of the tree, the term "ranges" as used herein may refer to groupings of contiguous blocks at any level.

In at least one embodiment of the technique, hosts 110 (1-N) issue IO requests 112(1-N) to the data storage system 116. The SP 120 receives the IO requests 112(1-N) at the communication interfaces 122 and initiates further processing. Such processing may include, for example, performing read and write operations on a file system, creating new files in the file system, deleting files, and the like. Over time, a file system changes, with new data blocks being allocated and allocated data blocks being freed. In addition, the file system manager 162 also tracks freed storage extents. In an example, storage extents are versions of block-denominated data, which are compressed down to sub-block sizes and packed together in multi-block segments. Further, a file system operation may cause a storage extent in a range to be freed, e.g., in response to a punch-hole or write-split operation. Further, a range may have a relatively large number of freed fragments but may still be a poor candidate for free-space scavenging if it has a relatively small number of allocated blocks. With one or more candidate ranges identified, the file system manager 162 may proceed to perform free-space scavenging on such range or ranges. Such scavenging may include, for example, liberating unused blocks from segments (e.g., after compacting out any unused portions), moving segments from one range to another to create free space, and coalescing free space to support contiguous writes and/or to recycle storage resources by returning such resources to a storage pool. Thus, file system manager 162 may scavenge free space, such as by performing garbage collection, space reclamation, and/or free-space coalescing.

As shown in FIG. 1, the data storage system 116 further comprises a file system reorganizer module 152 that implements the file system reorganization techniques described herein. As discussed further below in conjunction with FIGS. 2A through 6, in one or more embodiments, the exemplary file system reorganization module 152 performs file system reorganizer to achieve compaction of one or more allocation units and updates the VBMs accordingly.

Figure 2A:
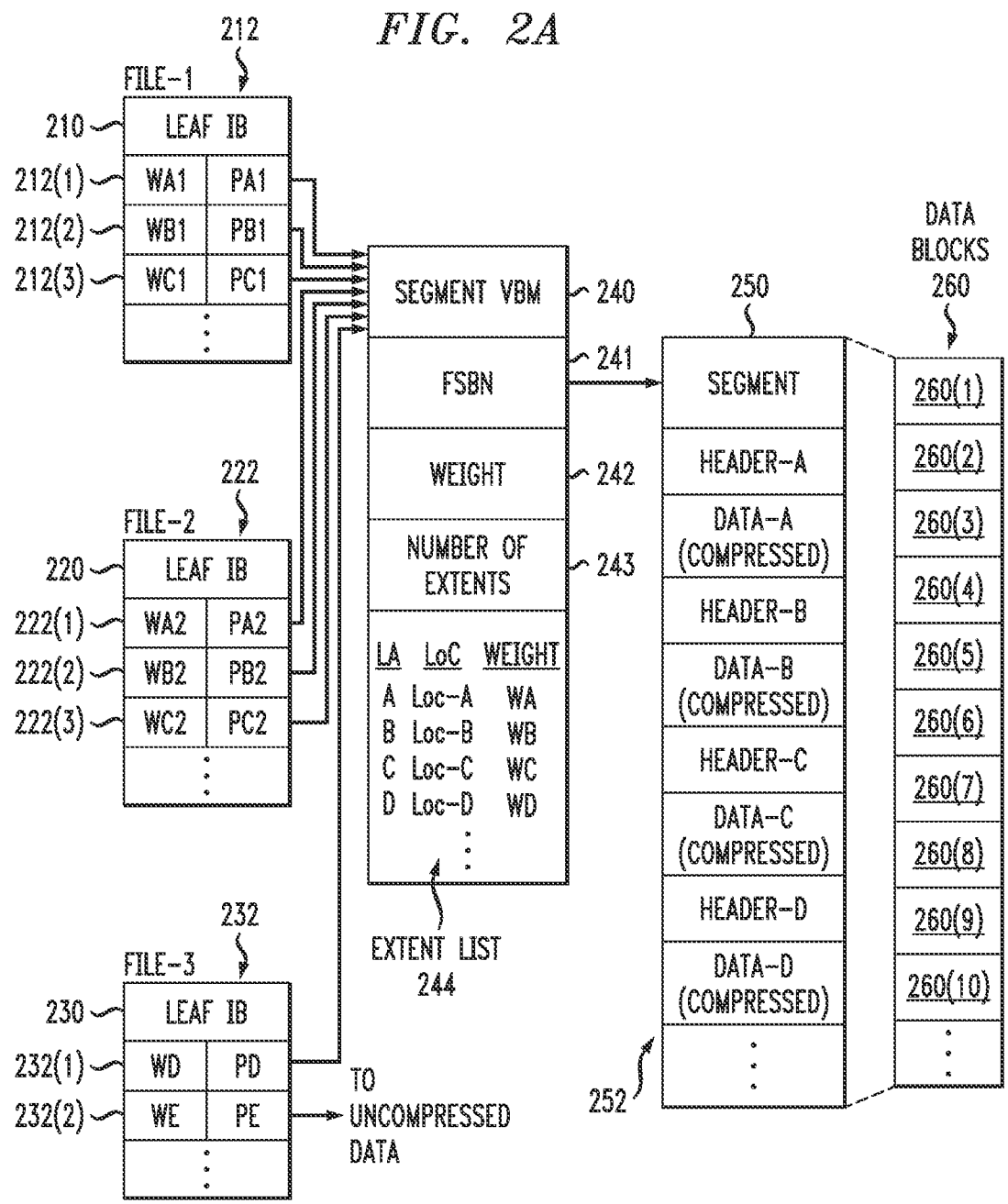
FIGS. 2A and 2B illustrate in further detail components that may be used in connection with the techniques described herein, before and after application of a file system reorganization operation, respectively according to one embodiment of the disclosure.

Referring now to FIG. 2A, shown is a more detailed representation of components that may be included in an embodiment using the techniques herein. Generally, FIG. 2A illustrates the VBM, compressed segment and data block arrangement before application of a file system reorganization operation, and FIG. 2B illustrates the arrangement of FIG. 2A after application of the file system reorganization operation.

As shown in FIG. 2A, a segment 250 that stores data of a file system is composed from multiple data blocks 260. Here, exemplary segment 250 is made up of at least ten data blocks 260(1) through 260(10); however, the number of data blocks per segment may vary. In an example, the data blocks 260 are contiguous, meaning that they have consecutive FSBNs in a file system address space for the file system. Although segment 250 is composed from individual data blocks 260, the file system treats the segment 250 as one continuous space. Compressed storage extents 252, i.e., Data-A through Data-D, etc., are packed inside the segment 250. In an example, each of storage extents 252 is initially a block-sized set of data, which has been compressed down to a smaller size. An 8-block segment may store the compressed equivalent of 12 or 16 blocks or more of uncompressed data, for example. The amount of compression depends on the compressibility of the data and the particular compression algorithm used. Different compressed storage extents 252 typically have different sizes. Further, for each compressed storage extent 252 in the segment 250, a corresponding weight is maintained, the weight arranged to indicate whether the respective storage extent 252 is currently part of any file in a file system by indicating whether other block pointers in the file system point to that block pointer.

The segment 250 has an address (e.g., FSBN 241) in the file system, and a segment VBM (Virtual Block Map) 240 points to that address. For example, segment VBM 240 stores a segment pointer, which stores the FSBN 241 of the segment 250. By convention, the FSBN of segment 250 may be the FSBN of its first data block, i.e., data block 260(1).

Although not shown, each data block 260(1)-260(10) may have its respective per-block metadata (BMD), which acts as representative metadata for the respective, data block 260(1)-260(10), and which includes a backward pointer to the segment VBM 240.

As further shown in FIG. 2A, the segment VBM 240 stores information regarding the number of extents 243 in the segment 250 and an extent list 244. The extent list 244 acts as an index into the segment 250, by associating each compressed storage extent 252, identified by logical address (e.g., LA values A through D, etc.), with a corresponding location within the segment 250 (e.g., Location values Loc-A through Loc-D, etc., which indicate physical offsets) and a corresponding weight (e.g., Weight values WA through WD, etc.). The weights provide indications of whether the associated storage extents are currently in use by any files in the file system. For example, a positive number for a weight may indicate that at least one file in the file system references the associated compressed storage extent 252. Conversely, a weight of zero may mean that no file in the file system currently references that compressed storage extent 252. It should be appreciated, however, that various numbering schemes for reference weights may be used, such that positive numbers could easily be replaced with negative numbers and zero could easily be replaced with some different baseline value. The particular numbering scheme described herein is therefore intended to be illustrative rather than limiting.

In an example, the weight (e.g., Weight values WA through WD, etc.) for a compressed storage extent 252 reflects a sum, or "total distributed weight," of the weights of all block pointers in the file system that point to the associated storage extent. In addition, the segment VBM 240 may include an overall weight 242, which reflects a sum of all weights of all block pointers in the file system that point to extents tracked by the segment VBM 240. Thus, in general, the value of overall weight 242 should be equal to the sum of all weights in the extent list 244.

Various block pointers 212, 222, and 232 are shown to the left in FIG. 2A. In an example, each block pointer is disposed within a leaf IB (Indirect Block), also referred to herein as a mapping pointer, which performs mapping of logical addresses for a respective file to corresponding physical addresses in the file system. Here, leaf IB 210 is provided for mapping data of a first file (F1) and contains block pointers 212(1) through 212(3). Also, leaf IB 220 is provided for mapping data of a second file (F2) and contains block pointers 222(1) through 222(3). Further, leaf IB 230 is provided for mapping data of a third file (F3) and contains block pointers 232(1) and 232(2). Each of leaf IBs 210, 220, and 230 may include any number of block pointers, such as 1024 block pointers each; however, only a small number are shown for ease of illustration. Although a single leaf IB 210 is shown for file-1, the file-1 may have many leaf IBs, which may be arranged in an IB tree for mapping a large logical address range of the file to corresponding physical addresses in a file system to which the file belongs. A "physical address" is a unique address within a physical address space of the file system.

Each of block pointers 212, 222, and 232 has an associated pointer value and an associated weight. For example, block pointers 212(1) through 212(3) have pointer values PA1 through PC1 and weights WA1 through WC1, respectively, block pointers 222(1) through 222(3) have pointer values PA2 through PC2 and weights WA2 through WC2, respectively, and block pointers 232(1) through 232(2) have pointer values PD through PE and weights WD through WE, respectively.

Regarding files F1 and F2, pointer values PA1 and PA2 point to segment VBM 240 and specify the logical extent for Data-A, e.g., by specifying the FSBN 241 of segment VBM 240 and an offset that indicates an extent position. In a like manner, pointer values PB1 and PB2 point to segment VBM 240 and specify the logical extent for Data-B, and pointer values PC1 and PC2 point to segment VBM 240 and specify the logical extent for Data-C. It can thus be seen that block pointers 212 and 222 share compressed storage extents Data-A, Data-B, and Data-C. For example, files F1 and F2 may be snapshots in the same version set. Regarding file F3, pointer value PD points to Data-D stored in segment 250 and pointer value PE points to Data-E stored outside the segment 250. File F3 does not appear to have a snapshot relationship with either of files F1 or F2. If one assumes that data block sharing for the compressed storage extents 252 is limited to that shown, then, in an example, the following relationships may hold:

WA=WA1+WA2;
WB=WB1+WB2;
WC=WC1+WC2;
WD=WD; and
Weight 242=$\Sigma$Wi (for i=a through d, plus any additional compressed storage extents 252 tracked by extent list 244).

The detail shown in segment 250 indicates an example layout of data items. In at least one embodiment of the current technique, each compression header is a fixed-size data structure that includes fields for specifying compression parameters, such as compression algorithm, length, CRC (cyclic redundancy check), and flags. In some examples, the header specifies whether the compression was performed in hardware or in software. Further, for instance, Header-A can be found at Loc-A and is immediately followed by compressed Data-A. Likewise, Header-B can be found at Loc-B and is immediately followed by compressed Data-B. Similarly, Header-C can be found at Loc-C and is immediately followed by compressed Data-C.

For performing writes, the ILC engine 140 generates each compression header (Header-A, Header-B, Header-C, etc.) when performing compression on data blocks 260, and directs a file system to store the compression header together with the compressed data. The ILC engine 140 generates different headers for different data, with each header specifying a respective compression algorithm. For performing data reads, a file system looks up the compressed data, e.g., by following a pointer 212, 222, 232 in the leaf IB 210, 220, 230 to the segment VBM 240, which specifies a location within the segment 250. A file system reads a header at the specified location, identifies the compression algorithm that was used to compress the data, and then directs the ILDC engine 150 to decompress the compressed data using the specified algorithm.

In at least one embodiment of the current technique, for example, upon receiving a request to overwrite and/or update data of data block (Data-D) pointed to by block pointer 232(a), a determination is made as to whether the data block (Data-D) has been shared among any other file. Further, a determination is made as to whether the size of the compressed extent (also referred to herein as "allocation unit") storing contents of Data-D in segment 250 can accommodate the updated data. Based on the determination, the updated data is written in a compressed format to the compressed extent for Data-D in the segment 250 instead of allocating another allocation unit in a new segment.

For additional details regarding the data storage system of FIGS. 1 and 2, see, for example, U.S. patent application Ser. No. 15/393,331, filed Dec. 29, 2016, "Managing Inline Data Compression in Storage Systems," (now U.S. Pat. No. 10,157,006), incorporated by reference herein in its entirety.

Figure 2B:
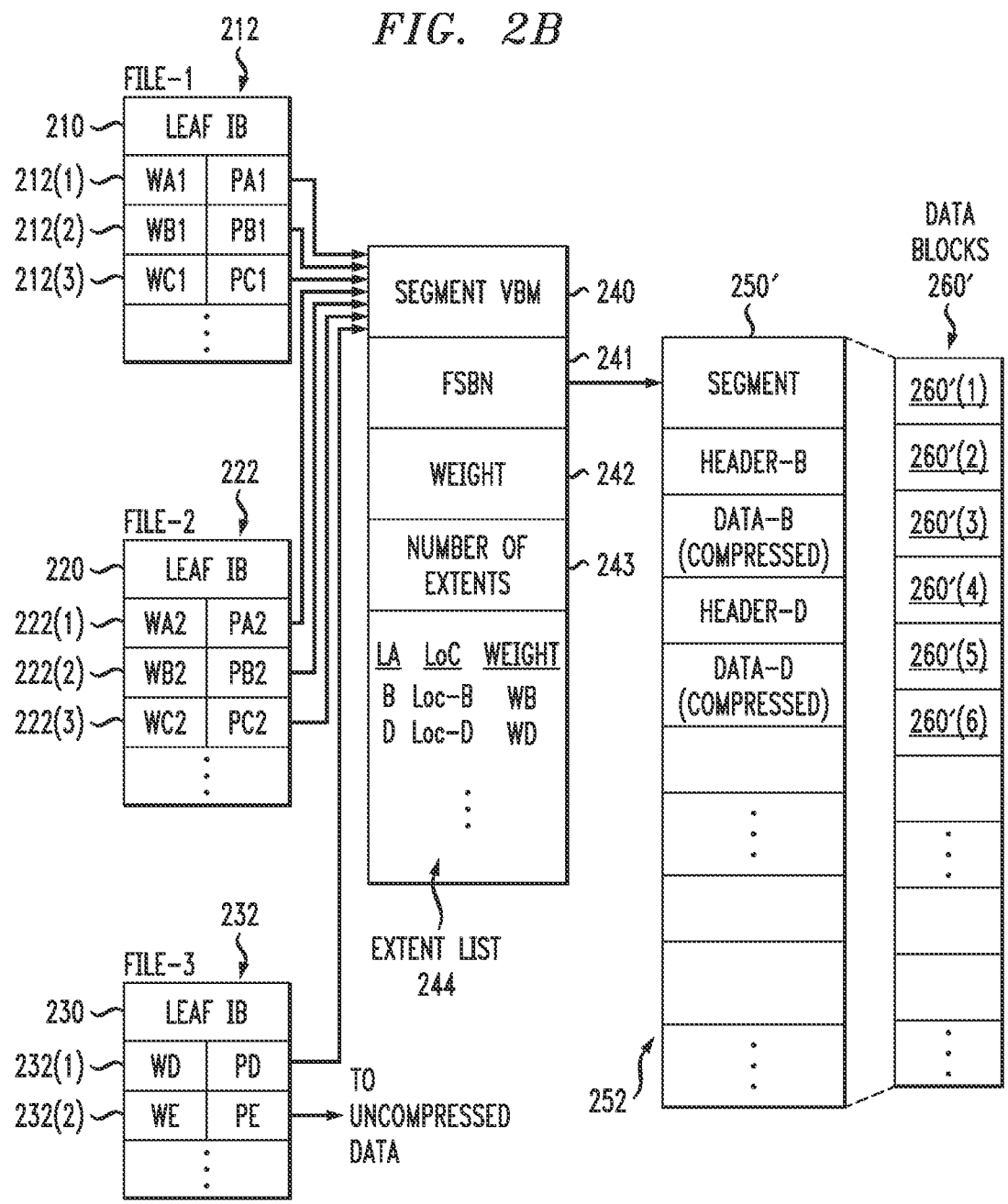

FIG. 2B illustrates the arrangement of FIG. 2A after application of a file system reorganization operation. Generally, the example of FIG. 2B assumes that data blocks A and C (e.g., allocation units A and C) in the compressed segment 250 of FIG. 2A are unreferenced blocks (e.g., having a weight value of 0, in one or more embodiments) and frees space through compaction by creating a modified compressed segment 250' with only referenced compressed data blocks B and D, as discussed further below in conjunction with FIGS. 5 and 6. Generally, FIG. 5 illustrates a compaction/relocation process, where a new modified compressed segment 250' is generated by relocating the original compressed segment 250, while FIG. 6 illustrates an in-place compaction process, where the new modified compressed segment 250' is generated by modifying the original compressed segment 250 in the same storage space.

As shown in FIG. 2B, and as discussed further below in conjunction with FIGS. 5 and 6, when data blocks A and C are removed from the compressed segment 250 of FIG. 2A to create modified compressed segment 250' and corresponding data blocks 260', the segment VBM 240 must be updated to reflect the new modified compressed segment 250'. In the case of a file system reorganization that relocates the compressed data, the FSBN 241 is updated to point to the new compressed segment 250', and the number of compressed extents 243 and extent list 244 are updated to remove the unreferenced compressed extents (e.g., A and C in FIG. 2B), leaving only referenced compressed extents (e.g., B and D in FIG. 2B). In the case of an in-place compaction, that modifies the compressed data in place, the FSBN 241 does not need to be updated, and the number of compressed extents 243 and extent list 244 are updated to remove the unreferenced compressed extents (e.g., A and C in FIG. 2B), leaving only referenced compressed extents (e.g., B and D in FIG. 2B).

In one or more embodiments, in the new compressed segment 250', data block B overwrites the prior location of data block A, and then referenced data block D is written at the end of data block B, to create a contiguous storage region.

Figures 3, 4:
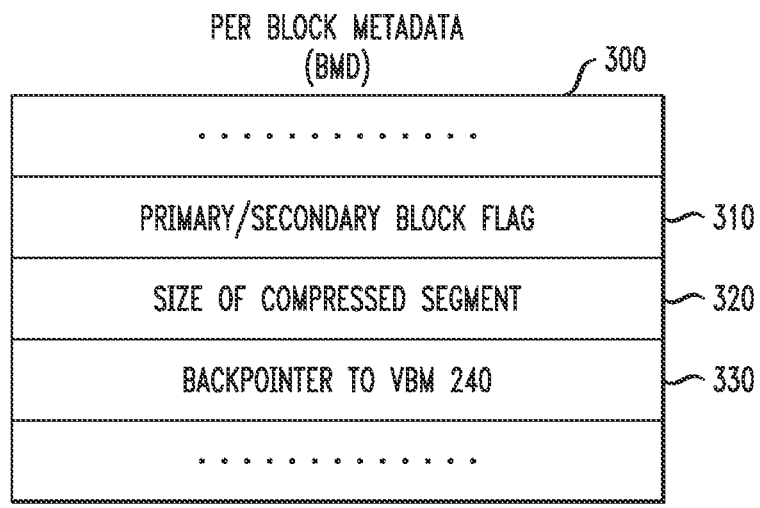
FIG. 3 illustrates an exemplary per block metadata component, according to one embodiment of the disclosure.
FIG. 4 illustrates exemplary pseudo code for a file system reorganization process, according to one embodiment of the disclosure.

FIG. 3 illustrates an exemplary per block metadata (BMD) component 300, according to one embodiment of the disclosure. As shown in FIG. 3, in one or more embodiments, the exemplary per block metadata component 300 comprises a primary/secondary block flag 310. For example, the primary/secondary block flag 310 can have a binary value of 1 for the primary (e.g., first) data block in a segment 250, and a binary value of 0 for all other data blocks in the segment 250. The exemplary per block metadata component 300 also indicates the size of the compressed segment 250 (optionally, only included in the per block metadata component 300 of the primary data block in field 320). The exemplary per block metadata component 300 also comprises a backpointer 330 to the VBM segment 240 of the compressed segment 250 comprising the respective data block.

FIG. 4 illustrates exemplary pseudo code for a file system reorganization process 400, according to one embodiment of the disclosure. As shown in FIG. 4, the exemplary file system reorganization process 400 initially chooses one or more slices or windows to evacuate (e.g., move data out of chosen slices/windows) during step 410.

For each allocated block in the selected slice/window, the exemplary file system reorganization process 400 looks up the per-block metadata to identify corresponding compressed blocks and length of the compressed segments during step 420, to build Relocations Lists comprised of (i) uncompressed data blocks; and (ii) compressed segments 250 and corresponding segment VBMs 240. Generally, the Relocations Lists built during step 420 identify the compressed segments and corresponding VBMs by evaluating the per block metadata component 300 to find the primary block of a given compressed segment.

During step 430, the exemplary file system reorganization process 400 executes the compaction/relocation process 500 of FIG. 5 to relocate compressed segments 250 from the relocation list, if free space is available to do the block relocation; or executes the in-place compaction process 600 of FIG. 6, if a window-based reorganization is being performed and no free space is available for block relocation.

It is noted that a space maker function normally performs file system reorganization using a window-based granularity, while a space reclaimer function normally performs file system reorganization using a slice-based granularity. In one or more embodiments, a window comprises 64 data blocks or allocation units, and a slice comprises 32K data blocks or allocation units. For a more detailed discussion of suitable techniques for window-based and slice-based file system reorganization, see, for example, U.S. patent application Ser. No. 14/319,455, filed Jun. 30, 2014, entitled "Reclaiming Space From File System Hosting Many Primary Storage Objects and Their Snapshots;" (now U.S. Pat. No. 9,400,741); U.S. patent application Ser. No. 14/674,566, filed Mar. 31, 2015, entitled "Coalescing File System Free Space to Promote Full-Stripe Writes;" (now U.S. Pat. No. 9,965,201), and/or U.S. patent application Ser. No. 15/281,338, filed Sep. 30, 2016, entitled "Managing Data Relocations in Storage Systems," (now U.S. Pat. No. 10,809,932), each incorporated by reference herein in its entirety.

FIG. 5 illustrates exemplary pseudo code for a compaction/relocation process 500, according to one embodiment of the disclosure. It is noted that in one or more embodiments, the allocation unit (e.g., a data block of 8 KB) is also the unit of compaction (e.g., the smallest compaction unit). Generally, the exemplary compaction/relocation process 500 converts freeable space to free space by compacting and relocating allocation units or data blocks.

As shown in FIG. 5, the exemplary compaction/relocation process 500 initially obtains a segment VBM 240 and corresponding compressed segment 250 for compaction during step 510. A lock is applied to the segment VBM 240 of the compressed segment 250 during step 520.

During step 530, the exemplary compaction/relocation process 500 identifies the referenced compressed extents in the compressed segment 250 (e.g., those data blocks having a non-zero weight in the segment VBM 240). A smaller space is allocated for the new compressed segment 250' (FIG. 2B) based on the freeable space indicated in the segment VBM 240 during step 540. For example, the freeable space represents the space that can be reclaimed from unreferenced compressed extents. The new allocated size for the new compressed segment 250' is generally equal to the current size of the original compressed segment 250 less the total size of unreferenced compressed extents in the original compressed segment 250.

The exemplary compaction/relocation process 500 copies the referenced compressed extents to a buffer to be written to new compressed segment 250' during step 550 to obtain contiguous referenced compressed extents in the new compressed segment 250'. The buffer is written to the new compressed segment 250' during step 560.

During step 570, the exemplary compaction/relocation process 500 updates the metadata (in segment VBM 240), as follows: (i) FSBN 241 is updated to point to the new compressed segment 250', and (ii) the number of compressed extents 243 and the extent list 244 are processed to remove unreferenced compressed extents, freeing original compressed segment 250, while recording metadata changes in a transaction log.

Upon completion of the metadata updates during step 570, the segment VBM 240 is unlocked during step 580.

FIG. 6 illustrates exemplary pseudo code for an in-place compaction process 600, according to one embodiment of the disclosure. As noted above in conjunction with the discussion of FIG. 4, the exemplary in-place compaction process 600 is performed as part of a window-based reorganization when no free space is available for a block relocation. Generally, the exemplary in-place compaction process 600 frees freeable blocks in a compressed segment 250.

The exemplary in-place compaction process 600 initially obtains the segment VBM 240 for the corresponding compressed segment 250 for compaction during step 610. Thereafter, the segment VBM 240 of the compressed segment 250 is locked during step 620.

During step 630, the in-place compaction process 600 identifies referenced compressed extents in the compressed segment 250 (e.g., having non-zero weight). A buffer of a "new allocated size" is allocated for overwriting the compressed segment 250 during step 640. In one or more embodiments, the "new allocated size" reflects the size of the unreferenced compressed extents that are being overwritten.

The exemplary in-place compaction process 600 moves only referenced compressed extents during step 650 to the allocated buffer, to be re-written to (same) segment 250 in order to obtain contiguous referenced compressed extents in the segment 250. The buffer is written to the compressed segment 250 during step 660.

During step 670, the exemplary in-place compaction process 600 updates the metadata (in VBM 240), as follows: number of compressed extents 243 and extent list 244 in segment VBM 240 are updated to remove unreferenced compressed extents, freeing unused tail (e.g., the freeable amount of blocks) of original compressed segment 250, while recording compacted version of the compressed segment data and metadata changes in a transaction log.

Upon completion of the metadata updates during step 670, the segment VBM 240 is unlocked during step 680.

CONCLUSION

One or more embodiments of the disclosure provide methods and apparatus for file system reorganization. In one or more embodiments, file system reorganization techniques are provided that improve the efficiency of a storage system.

The foregoing applications and associated embodiments should be considered as illustrative only, and numerous other embodiments can be configured using the techniques disclosed herein, in a wide variety of different applications.

It should also be understood that the disclosed techniques for file system reorganization, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed techniques for file system reorganization may be implemented using one or more processing platforms. One or more of the processing modules or other components may therefore each run on a computer, storage device or other processing platform element. A given such element may be viewed as an example of what is more generally referred to herein as a "processing device."

As noted above, illustrative embodiments disclosed herein can provide a number of significant advantages relative to conventional arrangements. It is to be appreciated that the particular advantages described above and elsewhere herein are associated with particular illustrative embodiments and need not be present in other embodiments. Also, the particular types of information processing system features and functionality as illustrated and described herein are exemplary only, and numerous other arrangements may be used in other embodiments.

In these and other embodiments, compute services can be offered to cloud infrastructure tenants or other system users as a PaaS offering, although numerous alternative arrangements are possible.

Some illustrative embodiments of a processing platform that may be used to implement at least a portion of an information processing system comprises cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components such as data storage system 116, or portions thereof, are illustratively implemented for use by tenants of such a multi-tenant environment.

Cloud infrastructure as disclosed herein can include cloud-based systems such as AWS, GCP and Microsoft Azure™. Virtual machines provided in such systems can be used to implement at least portions of data storage system 116 in illustrative embodiments. The cloud-based systems can include object stores such as Amazon™ S3, GCP Cloud Storage, and Microsoft Azure™ Blob Storage.

In some embodiments, the cloud infrastructure additionally or alternatively comprises a plurality of containers implemented using container host devices. For example, a given container of cloud infrastructure illustratively comprises a Docker container or other type of LXC. The containers may run on virtual machines in a multi-tenant environment, although other arrangements are possible. The containers may be utilized to implement a variety of different types of functionality within the file system reorganization devices. For example, containers can be used to implement respective processing devices providing compute services of a cloud-based system. Again, containers may be used in combination with other virtualization infrastructure such as virtual machines implemented using a hypervisor.

Illustrative embodiments of processing platforms will now be described in greater detail with reference to FIGS. 7 and 8. These platforms may also be used to implement at least portions of other information processing systems in other embodiments.

Figure 7:
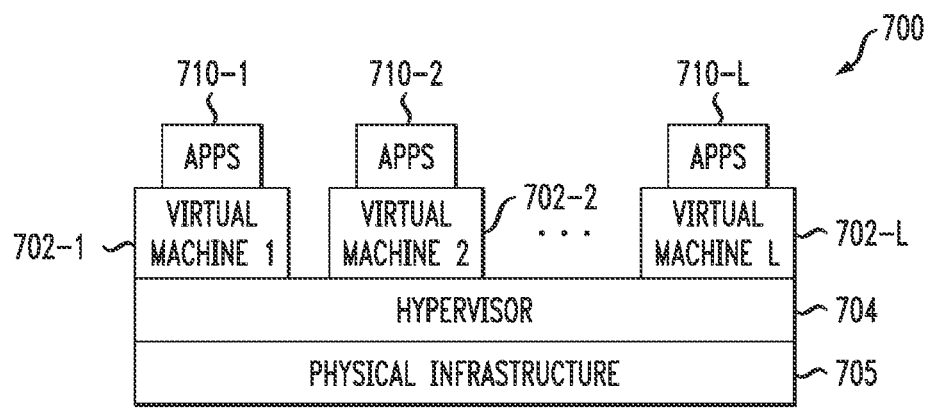
FIG. 7 illustrates an exemplary processing platform that may be used to implement at least a portion of one or more embodiments of the disclosure comprising a cloud infrastructure.

Referring now to FIG. 7, one possible processing platform that may be used to implement at least a portion of one or more embodiments of the disclosure comprises cloud infrastructure 700. The cloud infrastructure 700 in this exemplary processing platform comprises virtual machines (VMs) 702-1, 702-2, . . . 702-L implemented using a hypervisor 704. The hypervisor 704 runs on physical infrastructure 705. The cloud infrastructure 700 further comprises sets of applications 710-1, 710-2, . . . 710-L running on respective ones of the virtual machines 702-1, 702-2, . . . 702-L under the control of the hypervisor 704.

The cloud infrastructure 700 may encompass the entire given system or only portions of that given system, such as one or more of client, servers, controllers, or computing devices in the system.

Although only a single hypervisor 704 is shown in the embodiment of FIG. 7, the system may of course include multiple hypervisors each providing a set of virtual machines using at least one underlying physical machine. Different sets of virtual machines provided by one or more hypervisors may be utilized in configuring multiple instances of various components of the system.

An example of a commercially available hypervisor platform that may be used to implement hypervisor 704 and possibly other portions of the system in one or more embodiments of the disclosure is the VMware® vSphere™ which may have an associated virtual infrastructure management system, such as the VMware® vCenter™. As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC of Hopkinton, Mass. The underlying physical machines may comprise one or more distributed processing platforms that include storage products, such as VNX™ and Symmetrix VMAX™, both commercially available from Dell EMC. A variety of other storage products may be utilized to implement at least a portion of the system.

In some embodiments, the cloud infrastructure additionally or alternatively comprises a plurality of containers implemented using container host devices. For example, a given container of cloud infrastructure illustratively comprises a Docker container or other type of LXC. The containers may be associated with respective tenants of a multi-tenant environment of the system, although in other embodiments a given tenant can have multiple containers. The containers may be utilized to implement a variety of different types of functionality within the system. For example, containers can be used to implement respective compute nodes or cloud storage nodes of a cloud computing and storage system. The compute nodes or storage nodes may be associated with respective cloud tenants of a multi-tenant environment of system. Containers may be used in combination with other virtualization infrastructure such as virtual machines implemented using a hypervisor.

As is apparent from the above, one or more of the processing modules or other components of the disclosed file system reorganization systems may each run on a computer, server, storage device or other processing platform element. A given such element may be viewed as an example of what is more generally referred to herein as a "processing device." The cloud infrastructure 700 shown in FIG. 7 may represent at least a portion of one processing platform.

Figure 8:
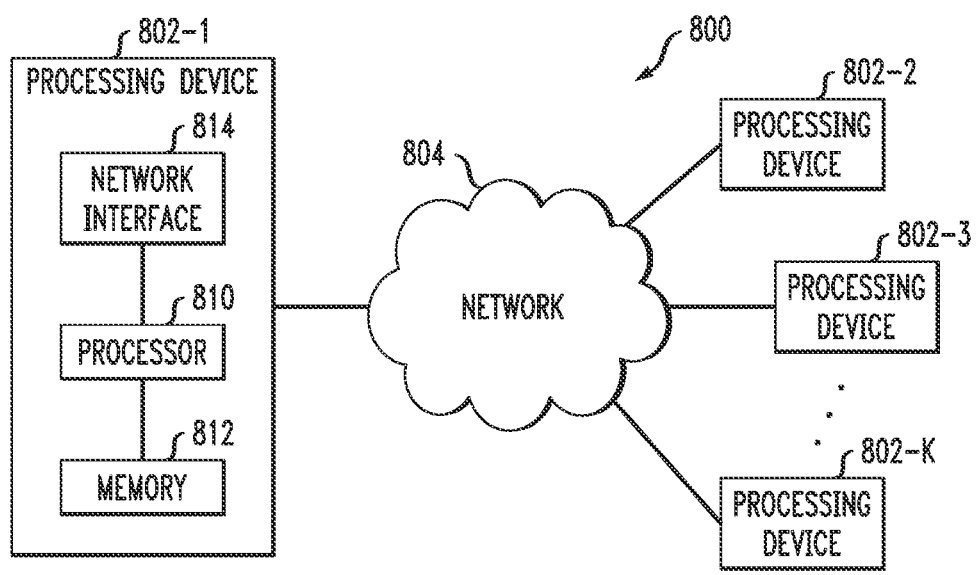
FIG. 8 illustrates another exemplary processing platform that may be used to implement at least a portion of one or more embodiments of the disclosure.

Another example of a processing platform is processing platform 800 shown in FIG. 8. The processing platform 800 in this embodiment comprises at least a portion of the given system and includes a plurality of processing devices, denoted 802-1, 802-2, 802-3, . . . 802-K, which communicate with one another over a network 804. The network 804 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 802-1 in the processing platform 800 comprises a processor 810 coupled to a memory 812. The processor 810 may comprise a microprocessor, a microcontroller, an application specific integrated circuit (ASIC), a field programmable gate array (FPGA) or other type of processing circuitry, as well as portions or combinations of such circuitry elements, and the memory 812, which may be viewed as an example of a "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 802-1 is network interface circuitry 814, which is used to interface the processing device with the network 804 and other system components, and may comprise conventional transceivers.

The other processing devices 802 of the processing platform 800 are assumed to be configured in a manner similar to that shown for processing device 802-1 in the figure.

Again, the particular processing platform 800 shown in the figure is presented by way of example only, and the given system may include additional or alternative processing platforms, as well as numerous distinct processing platforms in any combination, with each such platform comprising one or more computers, storage devices or other processing devices.

Multiple elements of system may be collectively implemented on a common processing platform of the type shown in FIG. 7 or 8, or each such element may be implemented on a separate processing platform.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the information processing system. Such components can communicate with other elements of the information processing system over any type of network or other communication media.

As indicated previously, components of an information processing system as disclosed herein can be implemented at least in part in the form of one or more software programs stored in memory and executed by a processor of a processing device. For example, at least portions of the functionality of pseudo code shown in FIGS. 4 through 6 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, compute services platforms, and file system reorganization platforms. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method, comprising:
obtaining a virtual block pointer that points to an original compressed segment to be reorganized, said original compressed segment comprising a plurality of compressed allocation units of data stored in a storage system using inline data compression, wherein the virtual block pointer comprises (i) an extent list identifying said plurality of compressed allocation units in said original compressed segment and (ii) a file system block number pointing to where the original compressed segment is stored in said storage system, wherein the plurality of compressed allocation units comprises at least one referenced compressed allocation unit associated with a weight indicating that the referenced compressed allocation unit is referenced by at least one file in a file system and at least one unreferenced compressed allocation unit associated with another weight indicating that the unreferenced compressed allocation unit is not referenced by a file in the file system;
copying only said referenced compressed allocation units in said original compressed segment to a new compressed segment in a substantially contiguous manner;
updating (i) said extent list to identify said referenced compressed allocation units in said new compressed segment, and (ii) said file system block number to point to where the new compressed segment is stored in said storage system; and
freeing said original compressed segment.

2. The method of claim 1, wherein said virtual block pointer is locked prior to said copying step and is unlocked following a substantial completion of said updating step.

3. The method of claim 1, wherein said step of copying said referenced compressed allocation units to said new compressed segment further comprises copying said referenced compressed allocation units to a buffer and writing said buffer to said new compressed segment.

4. The method of claim 1, further comprising the step of allocating space for said new compressed segment based on a size of said original compressed segment and a total size of said unreferenced allocation units in said original compressed segment.

5. The method of claim 1, further comprising the step of recording said updated extent list and said updated file system block number in a transaction log.

6. The method of claim 1, wherein said step of copying said referenced compressed allocation units to said new compressed segment is only performed when free space is available for relocation of one or more allocation units.

7. The method of claim 1, further comprising the step of performing a compaction process within said original compressed segment to obtain a compacted original compressed segment, when free space is not available for relocation of one or more allocation units.

8. The method of claim 7, wherein said compaction process comprises moving only said referenced compressed allocation units within said original compressed segment to obtain said compacted original compressed segment comprising a substantially contiguous set of referenced compressed allocation units.

9. The method of claim 8, further comprising the steps of (i) updating said extent list to remove said unreferenced compressed allocation units from said original compressed segment; (ii) freeing a tail portion of said original compressed segment; and (iii) recording said compacted original compressed segment and said updated extent list in a transaction log.

10. The method of claim 1, wherein said virtual block pointer is a metadata structure located in said file system that is placed between block pointers of leaf indirect blocks and respective data blocks of said file system to provide data block virtualization.

11. A computer program product, comprising a non-transitory machine-readable storage medium having encoded therein executable code of one or more software programs, wherein the one or more software programs when executed by at least one processing device perform the following steps: obtaining a virtual block pointer that points to an original compressed segment to be reorganized, said original compressed segment comprising a plurality of compressed allocation units of data stored in a storage system using inline data compression, wherein the virtual block pointer comprises (i) an extent list identifying said plurality of compressed allocation units in said original compressed segment and (ii) a file system block number pointing to where the original compressed segment is stored in said storage system, wherein the plurality of compressed allocation units comprises at least one referenced compressed allocation unit associated with a weight indicating that the referenced compressed allocation unit is referenced by at least one file in a file system and at least one unreferenced compressed allocation unit associated with another weight indicating that the unreferenced compressed allocation unit is not referenced by a file in the file system; copying only said referenced compressed allocation units in said original compressed segment to a new compressed segment in a substantially contiguous manner; updating (i) said extent list to identify said referenced compressed allocation units in said new compressed segment, and (ii) said file system block number to point to where the new compressed segment is stored in said storage system; and freeing said original compressed segment.

12. The computer program product of claim 11, further comprising the step of recording said updated extent list and said updated file system block number in a transaction log.

13. The computer program product of claim 11, further comprising the step of performing a compaction process within said original compressed segment to obtain a compacted original compressed segment, when free space is not available for relocation of one or more allocation units.

14. The computer program product of claim 13, wherein said compaction process comprises:

moving only said referenced compressed allocation units within said original compressed segment to obtain said compacted original compressed segment comprising a substantially contiguous set of referenced compressed allocation units;

updating said extent list to remove said unreferenced compressed allocation units from said original compressed segment;

freeing a tail portion of said original compressed segment; and recording said compacted original compressed segment and said updated extent list in a transaction log.

15. A system, comprising:

a memory; and at least one processing device, coupled to the memory, operative to implement the following steps:

obtaining a virtual block pointer that points to an original compressed segment to be reorganized, said original compressed segment comprising a plurality of compressed allocation units of data stored in a storage system using inline data compression, wherein the virtual block pointer comprises (i) an extent list identifying said plurality of compressed allocation units in said original compressed segment and (ii) a file system block number pointing to where the original compressed segment is stored in said storage system, wherein the plurality of compressed allocation units comprises at least one referenced compressed allocation unit associated with a weight indicating that the referenced compressed allocation unit is referenced by at least one file in a file system and at least one unreferenced compressed allocation unit associated with another weight indicating that the unreferenced compressed allocation unit is not referenced by a file in the file system;

copying only said referenced compressed allocation units in said original compressed segment to a new compressed segment in a substantially contiguous manner;

updating (i) said extent list to identify said referenced compressed allocation units in said new compressed segment, and (ii) said file system block number to point to where the new compressed segment is stored in said storage system; and freeing said original compressed segment.

16. The system of claim 15, further comprising the step of recording said updated extent list and said updated file system block number in a transaction log.

17. The system of claim 15, wherein said step of copying said referenced compressed allocation units to said new compressed segment is only performed when free space is available for relocation of one or more allocation units.

18. The system of claim 15, further comprising the step of performing a compaction process within said original compressed segment to obtain a compacted original compressed segment, when free space is not available for relocation of one or more allocation units.

19. The system of claim 18, wherein said compaction process comprises moving only said referenced compressed allocation units within said original compressed segment to obtain said compacted original compressed segment comprising a substantially contiguous set of referenced compressed allocation units.

20. The system of claim 19, further comprising the steps of (i) updating said extent list to remove said unreferenced compressed allocation units from said original compressed segment; (ii) freeing a tail portion of said original compressed segment; and (iii) recording said compacted original compressed segment and said updated extent list in a transaction log.

* * * * *

UNITED STATES PATENT AND TRADEMARK OFFICE
CERTIFICATE OF CORRECTION

PATENT NO. : 11,526,469 B1
APPLICATION NO. : 15/664245
DATED : December 13, 2022
INVENTOR(S) : Alexander Mathews et al.

It is certified that error appears in the above-identified patent and that said Letters Patent is hereby corrected as shown below:

In the Claims

Column 22, Line 48, cancel the text beginning with "11. A computer program" to and ending "compressed segment." in Column 23, Line 10, and insert the following claim:

--11. A computer program product, comprising a non-transitory machine-readable storage medium having encoded therein executable code of one or more software programs, wherein the one or more software programs when executed by at least one processing device perform the following steps:

obtaining a virtual block pointer that points to an original compressed segment to be reorganized, said original compressed segment comprising a plurality of compressed allocation units of data stored in a storage system using inline data compression, wherein the virtual block pointer comprises (i) an extent list identifying said plurality of compressed allocation units in said original compressed segment and (ii) a file system block number pointing to where the original compressed segment is stored in said storage system, wherein the plurality of compressed allocation units comprises at least one referenced compressed allocation unit associated with a weight indicating that the referenced compressed allocation unit is referenced by at least one file in a file system and at least one unreferenced compressed allocation unit associated with another weight indicating that the unreferenced compressed allocation unit is not referenced by a file in the file system;

copying only said referenced compressed allocation units in said original compressed segment to a new compressed segment in a substantially contiguous manner;

updating (i) said extent list to identify said referenced compressed allocation units in said new compressed segment, and (ii) said file system block number to point to where the new compressed segment is stored in said storage system; and freeing said original compressed segment.--

Signed and Sealed this
Seventh Day of March, 2023

Katherine Kelly Vidal
*Director of the United States Patent and Trademark Office*